(12) United States Patent
Siemieniec et al.

(10) Patent No.: US 9,941,272 B2
(45) Date of Patent: Apr. 10, 2018

(54) METHOD OF PRODUCING A SEMICONDUCTOR DEVICE

(71) Applicant: Infineon Technologies Austria AG, Villach (AT)

(72) Inventors: Ralf Siemieniec, Villach (AT); Dethard Peters, Hoechstadt (DE); Romain Esteve, Treffen (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/063,577

(22) Filed: Mar. 8, 2016

(65) Prior Publication Data

US 2016/0190121 A1   Jun. 30, 2016

Related U.S. Application Data (62) Division of application No. 13/685,283, filed on Nov. 26, 2012, now Pat. No. 9,293,558.

(51) Int. Cl.
*H01L 29/78* (2006.01)
*H01L 27/06* (2006.01)
(Continued)

(52) U.S. Cl.
CPC ...... *H01L 27/0629* (2013.01); *H01L 27/0635* (2013.01); *H01L 29/1095* (2013.01);
(Continued)

(58) Field of Classification Search
CPC ............. H01L 29/0615; H01L 29/0619; H01L 29/4236; H01L 29/6606; H01L 29/66068;
(Continued)

(56) References Cited

U.S. PATENT DOCUMENTS

| 5,998,836 A | 12/1999 | Williams |
| 7,582,922 B2 | 9/2009 | Werner |

(Continued)

FOREIGN PATENT DOCUMENTS

| CN | 1226751 A | 8/1999 |
| CN | 1547765 A | 11/2004 |

(Continued)

OTHER PUBLICATIONS

Takatsuka, Akio et al., "Shape Transformation of 4H-SiC Microtrenches by Hydrogen Annealing," Japanese Journal of Applied Physics 48 041105, 2009, pp. 1-3.

(Continued)

*Primary Examiner* — Yu Chen
(74) *Attorney, Agent, or Firm* — Murphy, Bilak & Homiller, PLLC (57) ABSTRACT

A semiconductor body has a drift region layer, a body region layer adjoining the drift region layer, and a source region layer adjoining the body region layer and forming a first surface of the semiconductor body. At least two diode regions extend from the first surface through the source and body region layers into the drift region layer. Each diode region and the drift region layer form one pn-junction. At least two trenches have first and second opposing sidewalls and a bottom such that each trench adjoins the body region layer on one sidewall, one diode region on the second sidewall and one pn-junction on the bottom. In each trench, a gate dielectric dielectrically insulates a gate electrode from the semiconductor body. Sections of the source and body region layers remaining after forming the diode regions form source regions and body regions, respectively.

7 Claims, 6 Drawing Sheets (51) Int. Cl.
  *H01L 29/423* (2006.01)
  *H01L 29/66* (2006.01)
  *H01L 29/10* (2006.01)
  *H01L 29/16* (2006.01)
  *H01L 29/06* (2006.01)
  *H01L 29/04* (2006.01)

(52) U.S. Cl.
  CPC ...... *H01L 29/1608* (2013.01); *H01L 29/4236* (2013.01); *H01L 29/6606* (2013.01); *H01L 29/6609* (2013.01); *H01L 29/66068* (2013.01); *H01L 29/66348* (2013.01); *H01L 29/66719* (2013.01); *H01L 29/66734* (2013.01); *H01L 29/7804* (2013.01); *H01L 29/7805* (2013.01); *H01L 29/7808* (2013.01); *H01L 29/7813* (2013.01); *H01L 29/045* (2013.01); *H01L 29/0615* (2013.01); *H01L 29/0696* (2013.01)

(58) Field of Classification Search
  CPC ......... H01L 29/66098; H01L 29/66106; H01L 29/66136; H01L 29/66734; H01L 29/7804; H01L 29/7805; H01L 29/7808; H01L 29/7813; H01L 29/861; H01L 29/866; H01L 29/66348; H01L 29/7397
  See application file for complete search history.

(56) References Cited

U.S. PATENT DOCUMENTS

| | | |
|---|---|---|
| 7,989,882 B2 | 8/2011 | Zhang et al. |
| 8,637,922 B1 | 1/2014 | Siemieniec et al. |
| 2003/0040144 A1 | 2/2003 | Blanchard et al. |
| 2007/0114602 A1 | 5/2007 | Saito et al. |
| 2008/0173876 A1 | 7/2008 | Ueno |
| 2012/0037920 A1 | 2/2012 | Treu et al. |
| 2012/0248461 A1 | 10/2012 | Masuda et al. |
| 2013/0001592 A1 | 1/2013 | Miyahara et al. |

FOREIGN PATENT DOCUMENTS

| | | |
|---|---|---|
| CN | 102376751 A | 3/2012 |
| JP | 2005333068 A | 12/2005 |
| JP | 2007149736 A | 6/2007 |
| JP | 2009188221 A | 8/2009 |

OTHER PUBLICATIONS

"CMF20120D-Silicon Carbide Power MOSFET 1200V 80 mΩ: Z-Fet MOSFET N-Channel Enhancement Mode", CMF20120D Rev. A, Cree, Inc., 2012, pp. 1-13.

METHOD OF PRODUCING A SEMICONDUCTOR DEVICE

TECHNICAL FIELD

Embodiments of the present invention relate to a semiconductor device, in particular a semiconductor device including a vertical transistor device and a diode connected in parallel with the transistor device.

BACKGROUND

Power transistors, which are transistors with voltage blocking capabilities of up to several hundred volts and with a high current rating, can be implemented as vertical MOS trench transistors. In this case, a gate electrode of the transistor can be arranged in a trench that extends in a vertical direction of the semiconductor body. The gate electrode is dielectrically insulated from source, body and drift regions of the transistor and is adjacent to the body region in a lateral direction of the semiconductor body. A drain region usually adjoins the drift region, and a source electrode is connected to the source region.

In many applications it is desirable to have a diode connected in parallel to a load path (drain-source path) of the transistor. An integrated body diode of the transistor may be used for this purpose. The body diode is formed by a pn junction between the body region and the drift region. In order to connect the body diode parallel to the load path of the transistor, the body region may simply be electrically connected to the source electrode. The body diode, however, may have a current rating that is lower than desired in some applications.

Power transistors may be implemented with conventional semiconductor materials such as silicon (Si) or silicon carbide (SiC). Due to the specific properties of SiC, the use of SiC allows for the implementation of power transistors with a higher voltage blocking capability (at a given on-resistance) than Si. High blocking voltages, however, result in high electric fields in the semiconductor body, specifically at the pn-junction between the body region and the drift region. Usually there are sections of the gate electrode and of the gate dielectric arranged close to this pn junction. Problems may occur, when the dielectric strength of the gate dielectric is not sufficient for a desired voltage blocking capability of the transistor device. In this case, the gate dielectric may breakdown early.

There is a need to provide a semiconductor device with a transistor device and a diode, wherein a gate electrode of the transistor is protected from high electric fields, and wherein the diode has a high current rating and low losses.

SUMMARY

According to an embodiment, a semiconductor device comprises at least two device cells integrated in a semiconductor body. Each device cell comprises a drift region, a source region, a drain region arranged between the source region and the drift region, a diode region, a pn junction between the diode region and the drift region, and a trench with a first sidewall, a second sidewall opposite the first sidewall, and a bottom, wherein the body region adjoins the first sidewall, the diode region adjoins the second sidewall, and the pn junction adjoins the bottom of the trench. Each device cell further includes a gate electrode arranged in the trench and dielectrically insulated from the body region, the diode region and the drift region by a gate dielectric. The diode regions of the at least two device cells are distant in a lateral direction of the semiconductor body.

According to another embodiment, a method of producing a semiconductor device is described. The method comprises providing a semiconductor body with a drift region layer, a body region layer adjoining the drift region layer, and a source region layer adjoining the body region layer and forming a first surface of the semiconductor body, forming at least two diode regions such that each diode region extends from the first surface through the source region layer and the body region layer into the drift region layer, wherein each diode region and the drift region layer form one pn-junction, and forming at least two trenches each having a first sidewall, a second sidewall opposite the first sidewall, and a bottom such that each trench adjoins the body region layer on one sidewall, one diode region on the second sidewall and one pn-junction on the bottom. The method further includes forming in each trench a gate electrode and a gate dielectric dielectrically insulating the gate electrode from the semiconductor body.

BRIEF DESCRIPTION OF THE DRAWINGS

Examples are explained below with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION

In the following Detailed Description, reference is made to the accompanying drawings, which form a part thereof, and which are shown by way of illustration specific embodiments in which the invention may be practiced.

Figure 1:
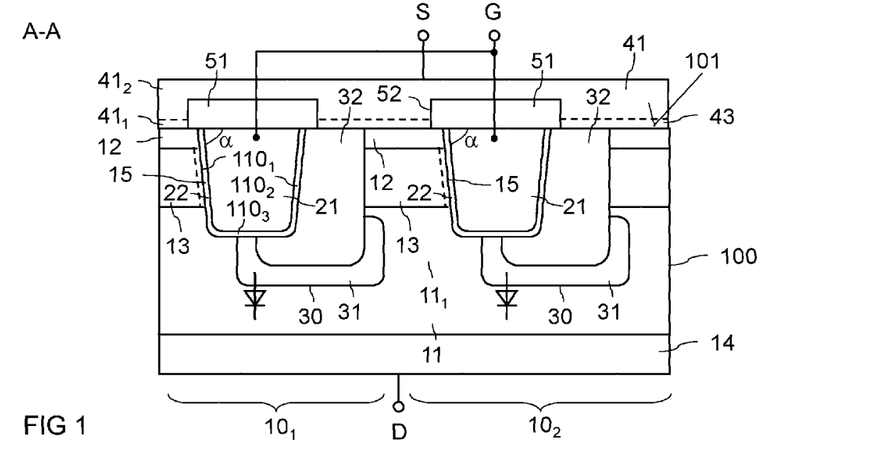
FIG. 1 illustrates a vertical cross sectional view of a semiconductor device according to a first embodiment.

FIG. 1 illustrates a vertical cross sectional view of a semiconductor device, specifically of a vertical semiconductor device, and more specifically of a vertical transistor device with an integrated diode. The semiconductor device includes a semiconductor body 100 and at least two device cells (transistor cells) $10_1$, $10_2$ integrated in the semiconductor body 100. The device cells will also be referred to as transistor cells in the following. In FIG. 1, only two device cells $10_1$, $10_2$ are illustrated. However, the semiconductor device may include more than two device cells, such as on the order of tens, hundreds, thousands, hundred-thousands or even millions device cells integrated in one semiconductor body 100.

In FIG. 1, the two device cells $10_1$, $10_2$ are labeled with different reference characters, while like features of the individual device cells $10_1$, $10_2$ are labeled with like reference characters. Referring to FIG. 1, each transistor cell $10_1$, $10_2$ includes a drift region 11, a source region 12 and a body region 13. The body region 13 is arranged between the source region 12 and the drift region 11. Each device cell $10_1$, $10_2$ further includes a diode region 30 and a pn junction formed between the diode region 30 and the drift region 11. In the embodiment of FIG. 1, the individual device cells $10_1$, $10_2$ share the drift region 11. That is, the individual device cells $10_1$, $10_2$ have one drift region 11 in common.

Referring to FIG. 1, each device cell $10_1$, $10_2$ further includes a gate electrode 21 arranged in a trench and dielectrically insulated from the body region 13, the diode region 30, and the drift region 11 by a gate dielectric 22. The trench with the gate electrode 21 of each device cell $10_1$, $10_2$ has a first sidewall $110_1$, a second sidewall $110_2$, opposite the first sidewall $110_1$ and a bottom $110_3$. The body region 13 of each device cell $10_1$, $10_2$ adjoins the first sidewall $110_1$ of the corresponding trench, the diode region 30 adjoins the second sidewall $110_2$ of the corresponding trench, and the pn junction between the drift region 11 and the diode region 30 adjoins the bottom $110_3$ of the corresponding trench.

Referring to FIG. 1, the individual diode region 30 of one device cell, such as device cell $10_1$ extends from a first surface 101 of the semiconductor body 100 adjacent to the source region 12 and the body region 13 of a neighboring device cell, such as device cell 102, into the drift region 11 where the pn junction is formed. An electrically insulating layer (insulation layer) 51 covers the first surface 101 and the gate electrodes 21. The insulation layer 51 has contact openings 52 where the insulation layer 51 uncovers second diode regions 32 and the source regions 12 of the individual device cells $10_1$, $10_2$. A source electrode 41 is formed on the insulation layer 51 and in the contact openings 52. The source electrode 41 is electrically insulated from the gate electrodes 21 by the insulation layer 51 and electrically connects the individual diode regions 30 and the individual source regions 12 to a source terminal S (only schematically illustrated in FIG. 1) or forms the source terminal S. Optionally, the source electrode 41 includes a first source electrode layer $41_1$ electrically contacting the diode regions 30 and the source regions 12, and a second source electrode layer $41_2$ electrically connecting the first source electrode layer $41_1$. The second source electrode layer $41_2$ is connected to the source terminal S or forms the source terminal S of the semiconductor device. The first source electrode layer $41_1$ includes, e.g., titanium (Ti), platinum (Pt), nickel alloys, or the like. The second electrode layer $41_2$ includes, e.g., aluminum (Al), copper (Cu), or the like.

Referring to FIG. 1, the semiconductor device further includes a drain region 14 adjoining the drift region 11. Optionally, a field-stop region (not illustrated) of the same doping type as the drift region 11 but more highly doped in the drift region 11 is arranged between the drift region 11 and the drain region 14. The drain region 14 is electrically connected to a drain terminal D (only schematically illustrated in FIG. 1). The individual device cells $10_1$, $10_2$ share one drain region 14. That is, there is one drain region 14 common to the individual device cells $10_1$, $10_2$.

The individual device cells $10_1$, $10_2$ are connected in parallel by having the individual source regions 12 connected to the source terminal S via the source electrode 41, by sharing the drain region 14 and having the drain region 14 connected to the drain terminal D, and by having the individual gate electrodes 21 electrically connected to a common gate terminal G. The connection of the gate electrodes 21 to the gate terminal G is only schematically illustrated in FIG. 1. One possible way to connect the gate electrodes 21 to the gate terminal G is explained with reference to FIGS. 2 and 3 herein below.

The semiconductor device of FIG. 1 is a MOS transistor device with an integrated diode. The transistor device can be implemented as an n-type device or as a p-type device. In an n-type device, the source regions and the drift region 11 are n-doped, while the body region 13 is p-doped. In a p-type device, the source regions 12 and the drift region 11 are p-doped, while the body regions 13 are n-doped. The transistor device can be implemented as an enhancement (normally-off) device or as a depletion (normally-on) device. In an enhancement device, the body regions 13 of the individual device cells $10_1$, $10_2$ adjoin the gate dielectric 22. In a depletion device there are channel regions 15 (illustrated in dashed lines in FIG. 1) of the same doping type as the source regions 12 and the drift region 11 along the gate dielectric 22. The channel region 15 of each device cell $10_1$, $10_2$ extends from the corresponding source region 12 to the drift region 11 along the gate dielectric 22 and is depleted of charge carriers when the transistor device is switched off. Alternatively, the gate dielectric 22 includes fixed charges that cause the generation of a conducting channel in the body region 13 along the gate dielectric 22 when the gate drive voltage (gate-source voltage) is zero.

Further, the transistor device can be implemented as a MOSFET or as an IGBT. In a MOSFET, the drain region 14 has the same doping type as the source regions 12 and the drift region 11, while in an IGBT the drain region 14 has a doping type complementary to the doping type of the source regions 12 and the drift region 11. In an IGBT, the drain region 14 is also referred to as collector region.

The diode regions 30 have the same doping type as the body regions 13, which is a doping type complementary to the doping type of the drift region 11. Since the diode region 30 of one device cell, such as device cell $10_1$ in FIG. 1, adjoins the body region 13 of a neighboring device cell, such as device cell $10_2$ in FIG. 1, the body region 13 of each device cell is electrically connected to the source electrode 41 through the diode region 30 of a neighboring device cell. Optionally, each diode region 30 includes two differently doped semiconductor regions, namely a first region 31 adjoining the drift region 11 and forming the pn junction with the drift region 11, and a second diode region 32 electrically connecting the first region 31 to the source electrode 41. The second diode region 32, which will also be referred to as contact region in the following, has a higher doping concentration than the first region 31. In the embodiment of FIG. 1, the contact region 32 of one device cell, such as device cell 101 in FIG. 1, adjoins the second sidewall $110_2$ of the corresponding trench and electrically connects the body region 13 of the neighboring device cell, such as device cell $10_2$ in FIG. 1, to the source electrode 41.

The diode region 30 of each device cell $10_1$, $10_2$ forms a diode with the drift region 11 and the drain region 14. A circuit symbol of this diode is also illustrated in FIG. 1 (the polarity of the circuit symbol illustrated in FIG. 1 relates to an n-type semiconductor device; in a p-type device the polarity is inverted). The diodes formed between the diode regions 30 of the individual device cells $10_1$, $10_2$ and the drift region 11 are connected in parallel and are connected in parallel with a load path (drain-source path) of the MOS transistor. The drain-source path of the MOS transistor is an internal path between the drain terminal D and the source terminal S. The individual diodes are reverse biased (block) when a voltage with a first polarity is applied between the drain and source terminals D, S of the MOS transistor, and the individual diodes are forward biased (conduct) when a voltage with a second polarity is applied between the drain and source terminals D, S. In an n-type semiconductor device, the diodes are reverse biased when a positive voltage is applied between the drain and source terminals D, S, and the diodes are forward biased when a negative voltage is applied between the drain and source terminals D, S (which is a positive voltage between the source and drain terminals S, D). The individual diodes are parallel to the body diodes of the transistor cells. The body diodes are the diodes formed by the body regions 13 and the drift region 11 of the individual device cells $10_1$, $10_2$. However, unlike the body diodes, the properties of the diodes between the diode regions 30 and the drift region 11 can be adjusted widely independent of the properties of the MOS transistor. Specifically, the diodes between the diode regions 30 and the drift region 11 can be implemented to have a high current rating by implementing the diode region 30 such that the pn junction between the diode region 30 and the drift region 11 has a relatively large area.

The semiconductor device of FIG. 1 can be operated like a conventional MOS transistor by applying a load voltage between the drain and source terminals D, S and by applying a drive potential to the gate electrode G. This operating principle is briefly explained with reference to an n-type semiconductor device. This operating principle, however, also applies to a p-type device, where in a p-type device the polarities of the voltages explained in the following have to be inverted. The semiconductor device is in a forward operation mode when a load voltage is applied between the drain and source terminals D, S that reverse biases the body diodes and the additional diodes (the diodes between the diode regions 30 and the drift region 11 of the individual device cells $10_1$, $10_2$. This voltage is a positive voltage in an n-type device. In the forward operation mode, the MOS transistor can be switched on and off through the drive potential applied to the gate terminal G. The MOS transistor is switched on (in an on-state) when the drive potential applied to the gate terminal G generates conducting channels in the body regions 13 between the source regions 12 and the drift region 11, and the MOS transistor is switched off (in an off-state) when the conducting channel in the body regions 13 are interrupted. The absolute value of the drive potential that switches on or switches off the transistor device is dependent on the specific type of the transistor device (enhancement device or depletion device).

The semiconductor device is in a reverse operation mode when a voltage is applied between the drain and source terminals D, S that forward biases the body diodes and the additional diodes. In this operation mode, the semiconductor device can only be controlled through the polarity of the load voltage, but not through the drive potential applied to the gate terminal G.

When the semiconductor device is in the forward operation mode and when the semiconductor device is switched off, the pn-junctions between the diode regions 30 and the drift region 11 and the pn-junctions between the body regions 13 and the drift region 11 are reverse biased so that a depletion region expands in the drift region 11. When the load voltage increases, the depletion region expands deeper into the drift region 11 in the direction of the drain region 14. When the load voltage increases and the depletion region expands deeper into the drift region 11, the electric field strength at the pn-junctions also increase. Since the pn-junctions between the body regions 13 and the first drift region 11 is close to the gate dielectric 22, the gate dielectric 22 may be damaged when high load voltages are applied, that is when high field strengths occur. In the semiconductor device of FIG. 1, however, the diode regions 30 of two neighboring device cells $10_1$, $10_2$ together with the drift region 11 act as a JFET (Junction Field-Effect Transistor). This JFET has channel regions $11_1$ between two neighboring diode regions 30. As the load voltage increases and as the electrical potential of the drift region 11 increases, the JFET pinches off the channel regions $11_1$ and prevents a field strength of an electric field at the pn-junctions between the body regions 13 and the drift region 11 to further increase when the load voltage further increases. The load voltage at which the channels $11_1$ of the JFET are pinched off, is, for example, dependent on a distance between two neighboring diode regions 30 in a lateral direction of the semiconductor body 100. The "lateral direction" of the semiconductor body 100 is perpendicular to the vertical direction, in which the drain region 14 is spaced from the body regions 13 and the diode regions 30, and is essentially parallel to the first surface 101. This lateral distance between two neighboring diode regions 30 is, for example, between 0.5 µm (micrometers) and 2 µm (micrometers) or between 0.25 times and 1.5 times the width of the trenches accommodating the gate electrodes 21. The "width" of the trenches is the distance between the first and second sidewalls $110_1$, $110_2$. In case the trenches are tapered, as illustrated in the embodiment of FIG. 1, the width is the largest distance between the first and second sidewalls.

Each device cell $10_1$, $10_2$ includes a channel region, which is a region of the body region 13 along the gate dielectric 22 or which is the optional channel region 15 (illustrated in dashed lines in FIG. 1). The channel region along the gate dielectric 22 enables charge carriers to flow from the source regions 12 to the drift region 11 when the transistor device is in the on-state. The diode region 30 of each device cell $10_1$, $10_2$ does not overlap the channel region. That is the pn junctions between the diode regions 30 and the drift region 11 adjoin the bottom of the individual gate trenches and do not extend beyond the gate trenches in the direction of the channel regions. Thus, the diode regions 30 do not constrain a charge carrier flow from the channel regions to the drain region 14.

The voltage blocking capability of the semiconductor device is, inter alia, dependent on a distance between the diode regions 30 and the drain region 14. This distance can be adjusted in the manufacturing process in accordance with the desired voltage blocking capability. As a rule of thumb, in an SiC semiconductor body 100, the distance between the drain region 14 and diode region 30 is between 0.8 micrometers and 1.0 micrometers per 100V voltage blocking capability.

The semiconductor body 100 may include a conventional semiconductor material, in particular a wide bandgap semiconductor material, such as silicon carbide (SiC), or the like. The device topology illustrated in FIG. 1 is, in particular, suitable for semiconductor devices implemented with SiC technology. When, e.g., the semiconductor body 100 includes SiC, the gate dielectric 22 may be implemented as a silicon oxide ($SiO_2$). A gate dielectric 22 of $SiO_2$ may suffer from degradation when exposed to high field strengths that may occur in high voltage devices. In such devices, the JFET formed by the diode regions 30 and the drift region 11 efficiently protects the gate dielectric 22 when the semiconductor device is switched off and a high load voltage is applied between the drain and source terminals D, S. In the reverse operation mode, the additional diode that is directly connected to the source electrode 41 is a highly efficient diode with low losses connected in parallel to the load path of the MOS transistor.

The doping concentration of the drift region 11 is, for example, between 1E14 $cm^{-3}$ and 1E17 $cm^{-3}$. The doping concentration of the body regions 13 is, for example, between 5E16 cm$^{-3}$ and 5E17 cm$^{-3}$. The doping concentrations of the source and drain regions 12, 14 are, for example, higher than 1E19 cm$^{-3}$. The doping concentration of the diode regions 30 is, for example, between 1E18 cm$^{-3}$ and 1E19 cm$^{-3}$.

Referring to FIG. 1, the body region 13 of each device cell $10_1$, $10_2$ adjoins the corresponding gate trench at the first sidewall $110_1$. Especially when the gate trenches have tapered sidewalls, the first and second sidewalls $110_1$, $110_2$ may correspond to different crystal planes of a crystal lattice of the semiconductor body 100. According to one embodiment, the semiconductor body 100 includes a hexagonal SiC crystal and the gate trenches have tapered sidewalls, such that the first sidewall $110_1$ corresponds to the 11-20-plane in the SiC crystal. In this case the individual channel regions feature a relatively low resistance. In this embodiment, the first sidewall $110_1$ is aligned with the c-axis of the crystal of the SiC semiconductor body 100. The c-axis (hexagonal main axis) is perpendicular to the growth plane (0001-plane) of the SiC crystal. This growth plane is not illustrated in FIG. 1. The bottom $110_3$ of the trench is essentially parallel to the first surface 101.

An angle α (alpha) between the first sidewall $110_1$ and the first surface 101 of the trench 110 is dependent on an orientation of the first surface relative to the growth plane (0001-plane). According to one embodiment, the first surface 101 is inclined relative to the growth plane, where an angle between the first surface 101 and the growth plane may be between 1° and 10°, in particular between 2° and 8°. In this case a is between 80° (90°−10°) and 89° (90°−1°), and in particular between 82° (90°−8°) and 88° (90°−2°). According to one specific embodiment, the angle between the first surface 101 and the growth plane is 4°, so that the angle α between the first surface 101 and the first sidewall $110_1$ of the trench 110 is 86°. There is a high charge carrier mobility in the SiC crystal along the 11-20 plane so that the alignment of the first sidewall $110_1$ to the c-axis results in a low resistance in the channel region along the gate dielectric 22 in the body region 13.

Figure 2:
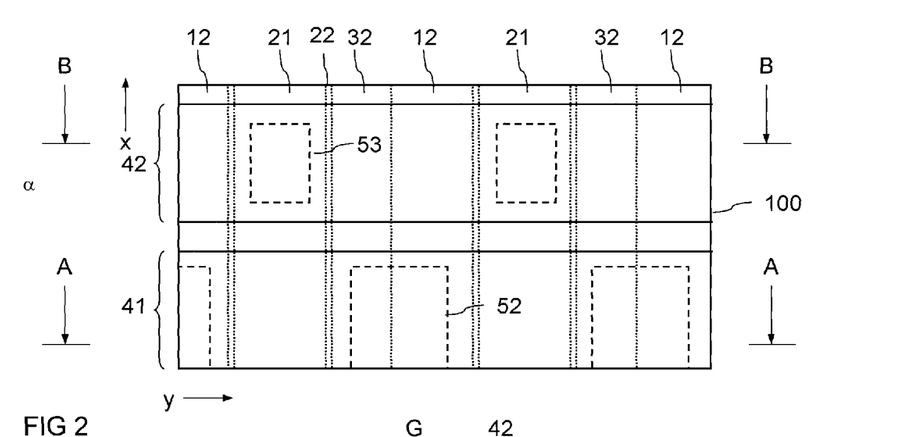
FIG. 2 illustrates a horizontal cross sectional view of one embodiment of the semiconductor device of FIG. 1.

The gate trenches can be elongated trenches, wherein the gate electrodes 21 can be connected to a gate terminal electrode at positions that are out of view in the vertical cross sectional view of FIG. 1. FIG. 2 shows a horizontal cross sectional view of one embodiment of the semiconductor device of FIG. 1 that includes elongated gate trenches. FIG. 2 illustrates features of the semiconductor device in three different horizontal layers of the semiconductor body 100. In FIG. 2, the gate electrodes 21 and the gate dielectrics 22 are illustrated in dotted lines. As can be seen from FIG. 2, the gate trenches with the gate electrodes 21 and the gate dielectric 22 are elongated trenches. The source regions 12 and the diode regions 30 with the optional contact regions 32 run parallel to the gate trenches. FIG. 2 further illustrates (in dashed lines) contact openings 52, 53 of the insulation layer 51. Referring to FIG. 2, there are first contact openings 52 above the source regions 12 and the diode regions 30, specifically the contact regions 32 of the diode regions 30, and second contact openings 52 above the gate electrodes 21. The second openings 53 are spaced apart from the first openings 52 in a first lateral direction x of the semiconductor body 100. The individual gate trenches and the individual diode regions 30 are spaced in a second lateral direction y that is perpendicular to the first lateral direction x, in the present embodiment. Referring to FIGS. 1 and 2, the source electrode 41 covers the insulation layer 51 in those regions where the first contact openings 52 are located and is electrically connected to the contact regions 32 and the source regions 12 in the first contact openings 52.

A gate connection electrode (gate runner) 42 is spaced apart from the source electrode 41 in the first lateral direction x and covers the insulation layer 51 in those regions where the second contact openings 53 are arranged. The gate connection electrode 42 is electrically connected to the gate electrodes 21 in the second contact openings 53. Referring to FIG. 2, the source electrode 41 and the gate connection electrode 42 may be essentially parallel.

Figure 3:
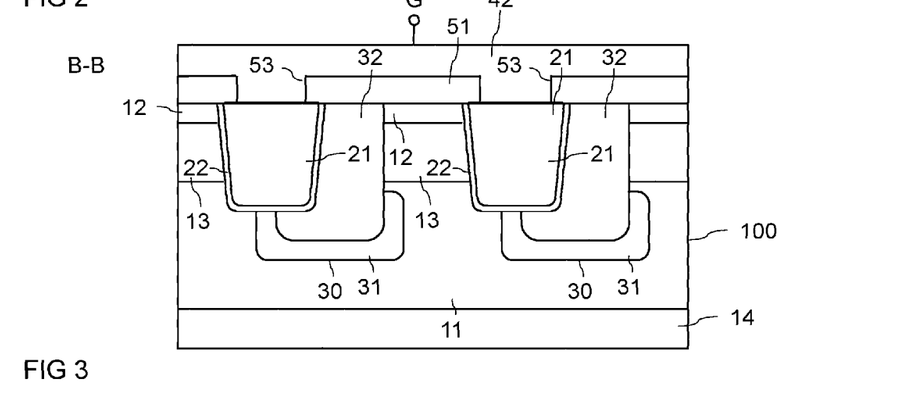
FIG. 3 illustrates a vertical cross sectional view of the semiconductor device of FIG. 2 in a section plane other than the section plane illustrated in FIG. 1.

The vertical cross sectional view illustrated in FIG. 1 corresponds to a vertical cross sectional view in section plane A-A illustrated in FIG. 2. FIG. 3 illustrates a vertical cross sectional view in section plane B-B illustrated in FIG. 2, where section plane B-B cuts through the gate connection electrode 42 and the second contact openings 53. Referring to FIG. 3, the insulation layer 51 separates the diode regions 30 and the source regions 12 from the gate connection electrode 42, and the gate connection electrode 42 is electrically connected to the gate electrodes 21 through the second contact openings 53.

According to one embodiment, the semiconductor device includes one source electrode 41 connected to the source terminal S, and one gate connection electrode 42 connected to the gate terminal G. According to a further embodiment (not illustrated), the semiconductor device includes several gate connection electrodes 42 each connected to the gate terminal G, and several source electrodes 41 each connected to the source terminal S where the gate connection electrodes 42 and the source electrodes 41 are essentially parallel and are arranged alternatingly in the first lateral direction x.

One embodiment of a method for producing a semiconductor device as explained herein before is explained with reference to FIGS. 4A to 4J in the following. Each of these figures shows a vertical cross sectional view of the semiconductor body 100 during individual method steps of the method.

Figure 4A:
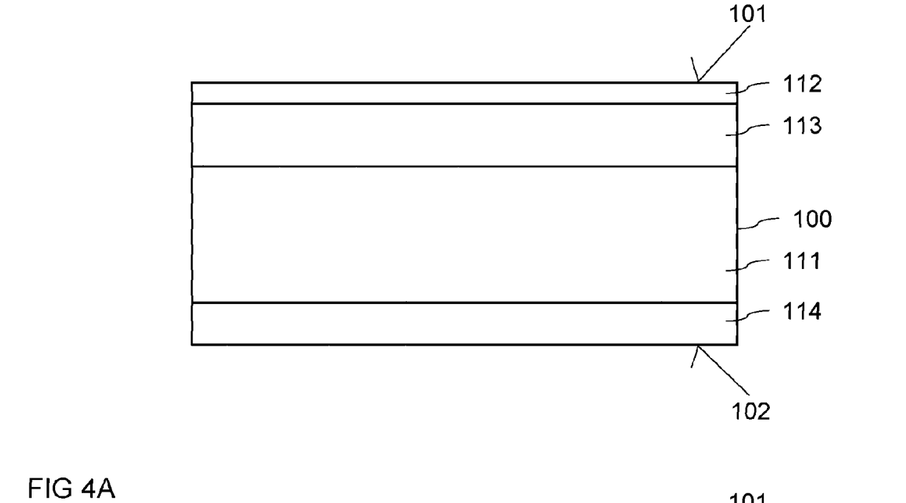
FIGS. 4A to 4J illustrate a method for producing a semiconductor device according to one embodiment.

Referring to FIG. 4A, the method includes providing a semiconductor body 100 with a drift region layer 111, a body region layer 113 adjoining the drift region layer 111, and a source region layer 112 adjoining the body region layer 113. The source region layer 112 forms a first surface 101 of the semiconductor body 100. The semiconductor body 100 further includes a drain region layer 114 adjoining the drift region layer 111 opposite the body region layer 113. Optionally, a field stop region layer (not illustrated) of the same doping type as the drift region layer 111, but more highly doped than the drift region layer 111 is arranged between the drain layer region 114 and the drift region layer 111. The drift region layer 111 forms the drift region 11, the body region layer 113 forms the body regions 13, the source region layer 112 forms the source regions 12, and the drain region layer 114 forms the drains region 14 of the finished semiconductor device. The doping types and the doping concentrations of the individual semiconductor layers 111-114 corresponds to the doping types and doping concentrations of the device regions formed by the individual semiconductor layers. These doping types and the doping concentrations of the individual device regions have been explained herein before.

The semiconductor body 100 of FIG. 4A can be produced using conventional techniques for producing a semiconductor body 100 having several differently doped semiconductor layers. According to one embodiment, producing the semiconductor body 100 includes providing a semiconductor substrate that forms the drain region layer 114, growing the drift region layer 111 as a first epitaxial layer on the drain region layer 114, growing the body region layer 113 as second epitaxial layer on the drift region layer 111, and growing the source region layer 112 as a third epitaxial layer on the body region layer 113. The individual epitaxial layers can be in-situ doped during the individual epitaxial processes.

According to a second embodiment, a semiconductor substrate is provided that has a doping concentration corresponding to the doping concentration of the drift region layer 111. By implantation processes doping atoms are implanted through the first surface 101 into this substrate, so as to form the body region layer 113 and the source region layer 112. Additionally, doping atoms are implanted into the substrate through a second surface 102 opposite the first surface 101 in order to form the drain region layer 114.

According to a third embodiment, a semiconductor substrate is provided that forms the drain region layer 114. An epitaxial layer is grown on the drain region layer 114, where the epitaxial layer has a doping concentration corresponding to the doping concentration of the drift region layer 111. This epitaxial layer forms the first surface 101 of the semiconductor body 100. Finally, doping atoms are implanted through the first surface 101 into the epitaxial layer, so as to form the body region layer 113 and the source region layer 112.

Figure 4B:
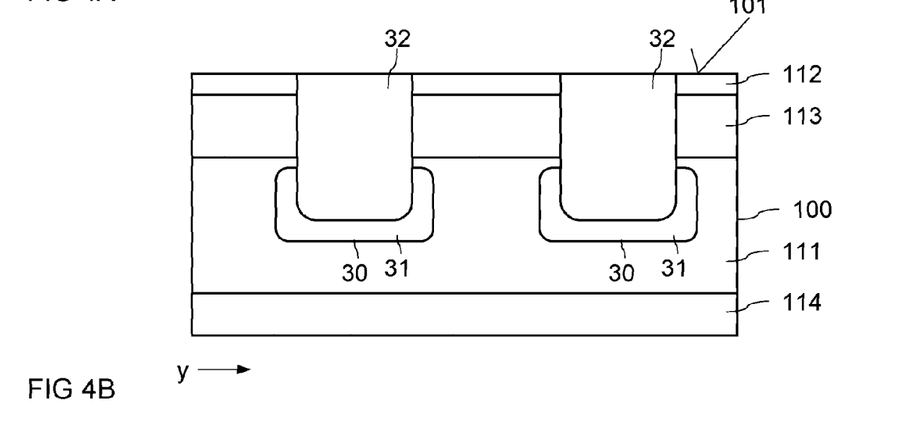

Referring to FIG. 4B, diode regions 30 that are spaced in the second lateral direction y of the semiconductor body 100 are formed. Forming the diode regions 30 may include forming a first diode region 31 in the drift region layer 111, and forming a second diode region (contact region) 32, where the contact region 32 extends from the first surface 101 through the source region layer 112 and the body region layer 113 into the first diode region 31. Forming the first and second diode regions 31, 32 may include conventional implantation processes. An embodiment of a method for producing the diode regions 30 is explained with reference to FIGS. 5A and 5B herein further below.

Figure 4C:
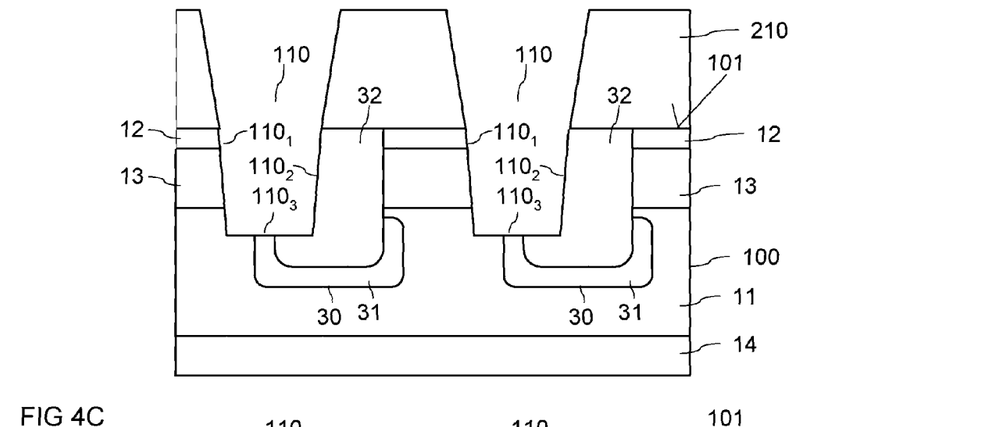

Referring to FIG. 4C, the method further includes producing trenches in the first surface 101 of the semiconductor body 100. The trenches each include a first sidewall $110_1$, a second sidewall $110_2$ opposite the first sidewall $110_1$, and a bottom $110_3$. The trenches subdivide the body region layer 113 and the source region layer 112 into several sections, wherein those regions that have the doping concentration of the body region layer 113 before forming the diode regions 30 form body regions 13, and those regions that have the doping concentration of the source region layer 112 before forming the diode region 30 form source regions 12 of the semiconductor device. Referring to FIG. 4C, the trenches 110 are formed such that the first sidewall $110_1$ of each trench 110 adjoins one source region 12 and one body region 13 and that the second sidewall $110_2$ of each trench 110 adjoins one diode region 30, specifically the contact region 32 of the diode region 30. In this case, a pn junction formed between the diode region 30 and the drift region 11 adjoins the bottom $110_3$ of each trench 110. Forming the trenches 110 may include conventional etching processes using an etch mask 210.

Figure 4D:
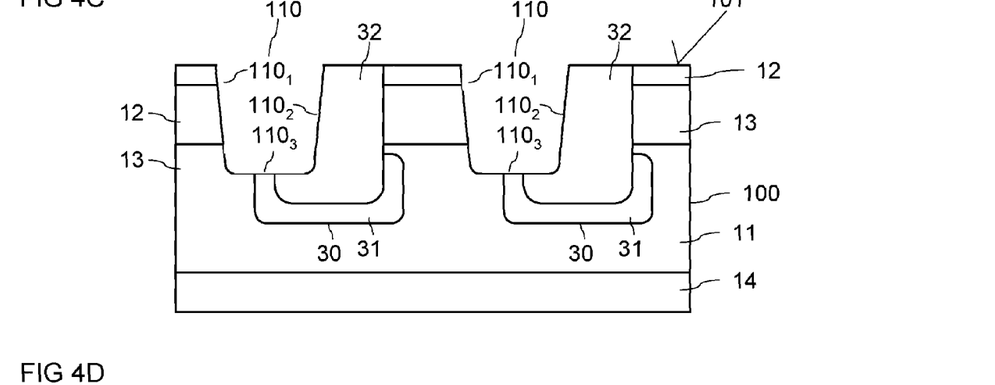
Figure 4E:
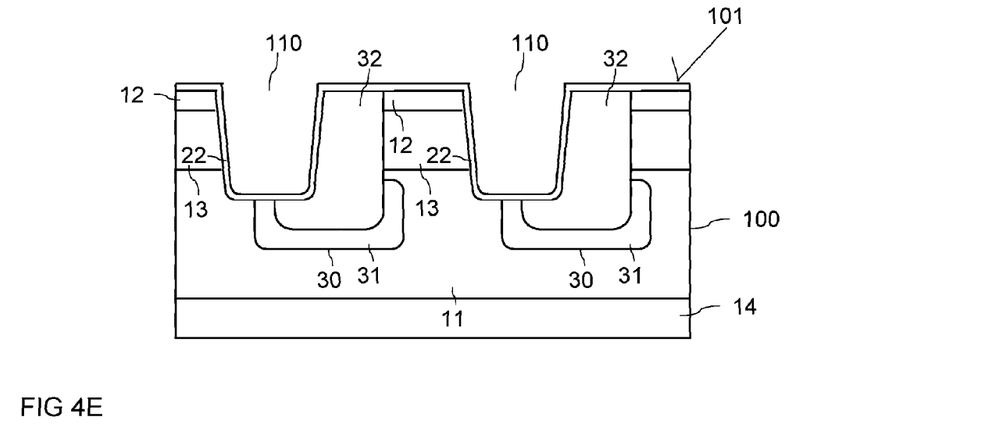

Optionally, there is a post processing of the trenches 110 in which corners between the sidewalls $110_1$, $110_2$ and the bottom $110_3$ of the individual trenches are rounded. The result of such a rounding process is illustrated in FIG. 4D. The rounding process may include a thermal treatment in a hydrogen containing atmosphere. According to one embodiment, the corners between the sidewalls $110_1$, $110_2$ and the bottom $110_3$ are formed with radius that is at least two times the thickness or at least four times the thickness of the gate dielectric 22 that is formed in next process steps. According to one embodiment, a radius of the corners is at least 300 nanometers (nm).

According to one embodiment, the trenches 110 are formed with tapered sidewalls. According to one embodiment, the semiconductor body 100 includes SiC, and the trenches 110 are formed with tapered sidewalls such that the first sidewalls $110_1$ are aligned with the c-axis of the SiC semiconductor crystal.

Figure 4F:
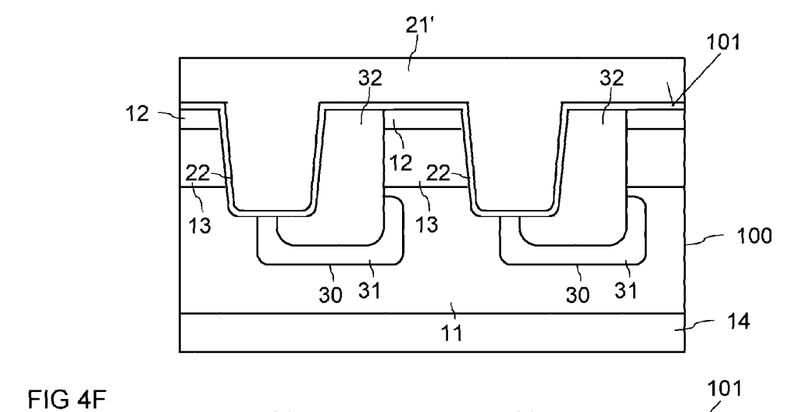
Figure 4G:
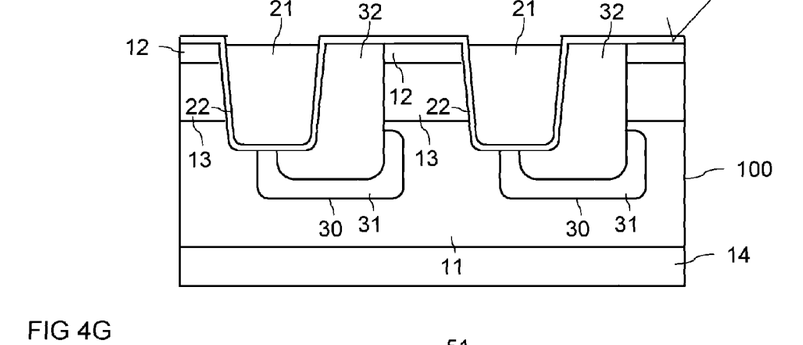
Figure 4H:
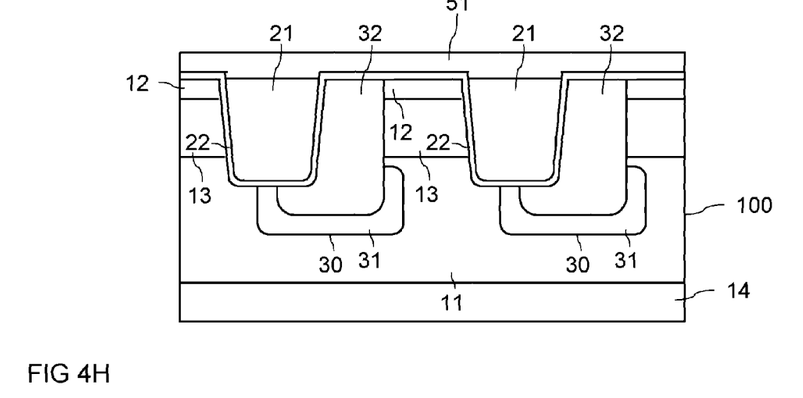
Figure 4I:
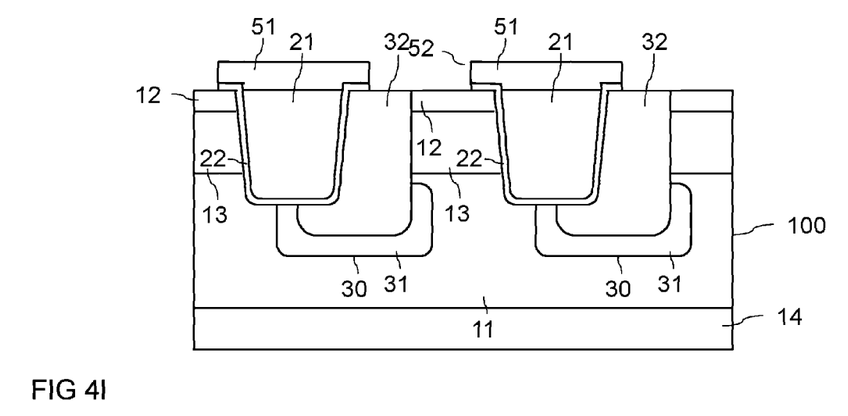
Figure 4J:
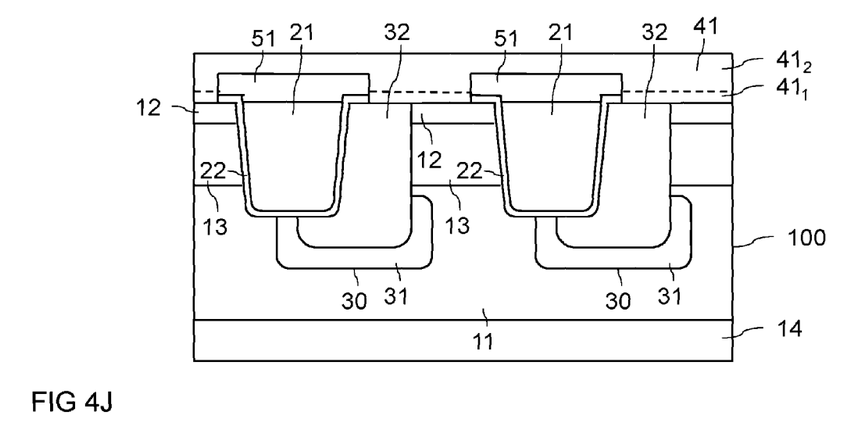

In next process steps illustrated in FIG. 4I, the gate dielectric 22 is formed on the sidewalls $110_1$, $110_2$ and the bottom $110_3$ of the trenches 110. Optionally, the gate dielectric 22 is also formed on the first surface 101 of the semiconductor body 100. According to one embodiment, the semiconductor body 100 includes SiC, and the gate dielectric 22 includes silicon dioxide ($SiO_2$). Forming the gate dielectric 22 may include an oxidation process or a combination of a deposition process and an oxidation process.

Referring to FIG. 4F, an electrode layer 21' is formed in the trenches 110 and above the first surface 101 of the semiconductor body 100. Those sections of the electrode layer 21' that are located in the trenches 110 form the gate electrodes 21 of the individual device cells. For example, the electrode layer 21' includes a highly doped polycrystalline semiconductor material, such as polysilicon, or a silicide.

Referring to FIG. 4G, the electrode layer 21' is removed from the first surface 101 but remains in the trenches 110 where it forms the gate electrodes 21. Removing the electrode layer 21' above the first surface 101 may include an etching process such as a dry etching process.

Referring to FIG. 4H, the insulation layer 51 is formed above the first surface 101 and the gate electrodes 21. The insulation layer 51 may be a conventional electrically insulating layer, such as an oxide. Forming the insulation layer 51 may include a chemical vapor deposition (CVD).

Referring to FIG. 4I, contact openings 52 are formed in the insulation layer 51. Forming the contact openings may include conventional etching processes using etch masks. FIG. 4I illustrates forming the first contact openings 52 above the diode regions 30 and the source regions 12. Equivalently, the second contact openings 53 are formed above the gate electrode 21 in regions that are out of view in the vertical cross section of FIG. 4I.

Finally, the source electrode 41 is formed. The source electrode 41 electrically contacts the diode regions 30 and the source regions 12 in the first contact openings 52. Optionally, the source electrode 41 includes the two sublayers $41_1$, $41_2$ explained before. Forming the source electrode 41 may include a metal deposition process, such as one of a CVD process, an evaporation process, a galvanic process and a sputter process. The source electrode 41 includes an electrically conductive material, such as a metal or a silicide. Equivalently, the gate connection electrode 42 is formed in regions that are out of view in FIG. 4J and contacts the gate electrodes 21 in the second contact openings 53.

Figure 5A:
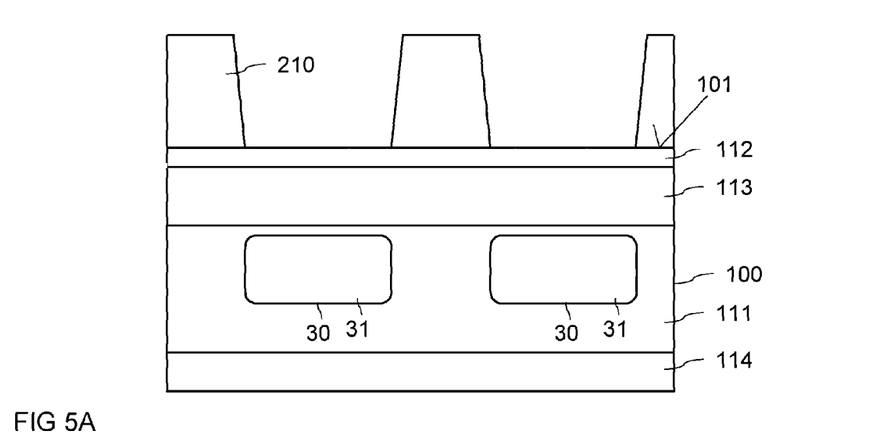
FIGS. 5A and 5B illustrate one embodiment of a method for producing a semiconductor device structure illustrated in FIG. 4B.
Figure 5B:
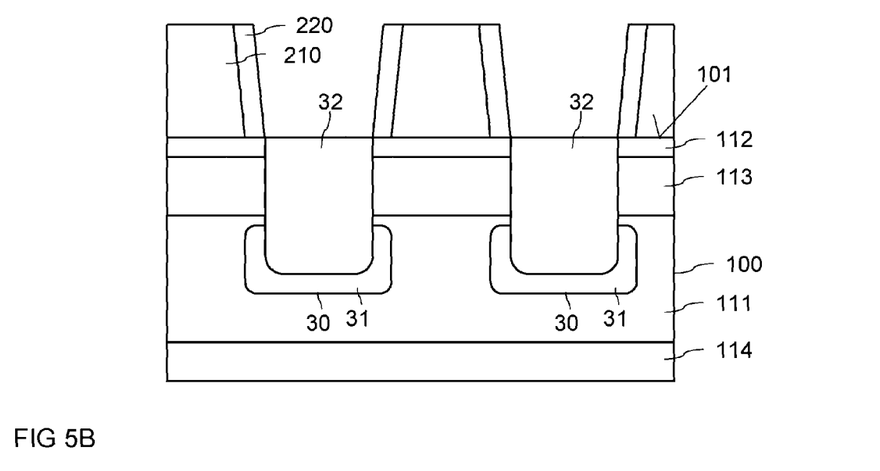

FIGS. 5A and 5B illustrate one embodiment of a method for producing the diode regions 30. In the method of FIGS. 5A and 5B, the diode regions 30 are formed with a first diode region 31 and a second diode region 32. Referring to FIG. 5A, forming the first diode region 31 may include an implantation process using an implantation mask 210. The implantation energy of the implantation process is adjusted such that the doping atoms are implanted into the drift region layer 111.

Referring to FIG. 5B, forming the second diode regions (contact regions) 32 includes a further implantation process using a further implantation mask. The further implantation mask can be obtained by forming spacers 220 along sidewalls of the openings of the first implantation mask 210. Forming the contact region 32 may include several subsequent implantation processes with different implantation energies. Further, each implantation process, also the implantation processes explained with reference to FIGS. 4A to 4J before, include a thermal treatment for activating the implanted doping atoms.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

What is claimed is:

1. A method of producing a semiconductor device, the method comprising:
providing a semiconductor body comprising a drift region layer, a body region layer adjoining the drift region layer, and a source region layer adjoining the body region layer and forming a first surface of the semiconductor body;
forming at least two diode regions such that each diode region extends from the first surface through the source region layer and the body region layer into the drift region layer, wherein each diode region and the drift region layer form a pn-junction;
forming at least two trenches each having a first sidewall, a second sidewall opposite the first sidewall, and a bottom such that each trench adjoins the body region layer on the first sidewall, one of the diode regions on the second sidewall and at least a portion of the pn-junction on the bottom;
forming in each trench a gate electrode and a gate dielectric dielectrically insulating the gate electrode from the semiconductor body,
forming a source electrode electrically connected to the source region layer and the at least two diode regions,
wherein sections of the source region layer remaining after forming the diode regions form source regions and wherein sections of the body region layer remaining after forming the diode regions form body regions,
wherein the at least two diode regions each comprise a first region and a second region,
wherein the second region connects the first region to the source electrode, wherein the first region has a lower doping concentration than the second region, and
wherein, for each of the at least two diode regions, the second region vertically extends from the source electrode to a lower side of the second region that is beneath the bottom of the trenches, and wherein, for each of the at least two diode regions, the first region is interposed between the lower side of the second region and the drift region layer along an entire span of the lower side so as to completely separate the lower side from the drift region layer.

2. The method of claim 1, further comprising:
forming an insulation layer on the first surface;
forming a first contact opening in the insulation layer above each diode region and each source region.

3. The method of claim 2, further comprising:
forming a second contact opening in the insulation layer above each gate electrode; and
forming a gate connection electrode that is electrically connected to the gate electrode in each second contact opening.

4. The method of claim 1, wherein the trenches are elongated trenches.

5. The method of claim 1, wherein the semiconductor body comprises an SiC crystal, and wherein the trenches are formed such that the first sidewall of the trenches is aligned with a c-axis of the SiC crystal.

6. The method of claim 5, wherein the first trenches are formed such that an angle between the first surface of the semiconductor body and the first sidewall is between 80° and 89°.

7. The method of claim 1, wherein sections of the drift region layer remaining after forming the diode regions form a drift region, and wherein the first regions of the at least two diode regions are separated from each other by the drift region.

* * * * *

UNITED STATES PATENT AND TRADEMARK OFFICE
CERTIFICATE OF CORRECTION

PATENT NO. : 9,941,272 B2
APPLICATION NO. : 15/063577
DATED : April 10, 2018
INVENTOR(S) : R. Siemieniec et al.

Page 1 of 1

It is certified that error appears in the above-identified patent and that said Letters Patent is hereby corrected as shown below:

Column 12, Line 49 (Claim 6, Line 1), please change "the first trenches" to -- the trenches --.

Signed and Sealed this
Tenth Day of July, 2018

Andrei Iancu
*Director of the United States Patent and Trademark Office*